(12) United States Patent
Li et al.

(10) Patent No.: US 12,369,433 B2
(45) Date of Patent: Jul. 22, 2025

(54) LIGHT-EMITTING STRUCTURE, METHOD FOR PRODUCING THE LIGHT-EMITTING STRUCTURE, AND LIGHT-EMITTING DEVICE

(71) Applicant: HUBEI SAN'AN OPTOELECTRONICS CO., LTD., Hubei (CN)

(72) Inventors: Shuiqing Li, Xiamen (CN); Weihua Du, Xiamen (CN); Chaohsu Lai, Xiamen (CN); Heqing Deng, Xiamen (CN)

(73) Assignee: HUBEI SAN'AN OPTOELECTRONICS CO., LTD., Hubei (CN)

( * ) Notice: Subject to any disclaimer, the term of this patent is extended or adjusted under 35 U.S.C. 154(b) by 500 days.

(21) Appl. No.: 17/930,186

(22) Filed: Sep. 7, 2022

(65) Prior Publication Data
US 2023/0006092 A1    Jan. 5, 2023

Related U.S. Application Data

(63) Continuation-in-part of application No. PCT/CN2020/078410, filed on Mar. 9, 2020.

(51) Int. Cl.
*H10H 20/812* (2025.01)
*H10H 20/01* (2025.01)
*H10H 20/825* (2025.01)

(52) U.S. Cl.
CPC ...... *H10H 20/812* (2025.01); *H10H 20/0137* (2025.01); *H10H 20/8252* (2025.01)

(58) Field of Classification Search
CPC .................................................. H10H 20/812
See application file for complete search history.

(56) References Cited

U.S. PATENT DOCUMENTS

2020/0287077 A1*  9/2020  Zhang ................ H10F 77/1243

FOREIGN PATENT DOCUMENTS

CN          103682001 A       3/2014

OTHER PUBLICATIONS

Search Report issued to PCT application No. PCT/CN2020/078410 on Oct. 20, 2020.

* cited by examiner

*Primary Examiner* — Ajay Ojha
*Assistant Examiner* — Hajar Kolahdouzan
(74) *Attorney, Agent, or Firm* — MUNCY, GEISSLER, OLDS & LOWE, P.C.

(57) ABSTRACT

A light-emitting structure includes an n-type layer, an active layer, and a p-type layer. The active layer has N quantum well structure periods, each of the N quantum-well structure periods has a well layer and at least one barrier layer. The N quantum-well structure periods include a first light-emitting section and a second light-emitting section. The first light-emitting section is closer to the n-type layer than the second light-emitting section. A method for producing the light-emitting structure, and a light-emitting device that has the light-emitting structure are also disclosed.

22 Claims, 5 Drawing Sheets

LIGHT-EMITTING STRUCTURE, METHOD FOR PRODUCING THE LIGHT-EMITTING STRUCTURE, AND LIGHT-EMITTING DEVICE

CROSS-REFERENCE TO RELATED APPLICATION

This application is a continuation-in-part application of PCT International Application No. PCT/CN2020/078410 filed on Mar. 9, 2020. The entire content of the international patent application is incorporated herein by reference.

FIELD

The present disclosure relates to a semiconductor optoelectronic device, and more particularly to a light-emitting structure, a method for producing the light-emitting structure, and a light-emitting device including the light-emitting structure.

BACKGROUND

A conventional light-emitting structure used in a light-emitting diode generally has a peak wall plug efficiency (Peak WPE) at a current density greater than 5 A/cm$^2$. FIG. 11 illustrates the relationship between wall plug efficiency (WPE) and current density, the conventional light-emitting structure is commonly operated at a relatively high current density of greater than 10 A/cm$^2$.

However, a mobile device such as a smart phone or a wearable device including a smart watch and a smart band requires a micro light-emitting diode operable at a nanoampere-level current, which is convertible into a current density ranging from 0.1 A/cm$^2$ to 1 A/cm$^2$. At low current densities of less than 1 A/cm$^2$, the photoelectric conversion efficiency of the conventional light-emitting structure will be very unstable, and the photoelectric conversion efficiency may drop sharply as the current changes only slightly. Therefore, the conventional light-emitting structure is inapplicable to electronic devices operated at low current.

Regarding the development of a light-emitting structure for micro light-emitting diodes in electronic devices operated at low current, ON 107833953 discloses a growth method for producing a multi quantum well (MQW) structure of a micro light-emitting diode. The multi quantum well structure includes a blocking layer interposed between a well layer and a barrier layer. The well layer is made of indium gallium nitride (InGaN). The blocking layer and the barrier layer are made of gallium nitride (GaN), and hydrogen gas is introduced as a carrier gas during a deposition process of the barrier layer. However, quality and stress of lattices in the MQW structure of CN 107833953 are unsatisfying, and there is still a need in the art to provide an improved light-emitting structure applicable to the electronic devices operated at low current.

SUMMARY

Therefore, an object of the disclosure is to provide a light-emitting structure, a method for producing the light-emitting structure, and a light-emitting device including the light-emitting structure, those can alleviate or overcome the aforesaid shortcomings of the prior art.

According to a first aspect of the disclosure, a light-emitting structure includes an n-type layer, an active layer, and a p-type layer. The active layer is disposed on the n-type layer and has N quantum-well structure periods. Each of said N quantum-well structure periods has a well layer and at least one barrier layer. The p-type layer is disposed on the active layer and opposite to the n-type layer. The N quantum-well structure periods include $N_1$ quantum-well structure periods that defines a first light-emitting section, and $N_2$ quantum-well structure periods that defines a second light-emitting section. The first light-emitting section is closer to the re-type layer than the second light-emitting section. Either of $N_1$ and $N_2$ is not less than 1, and $N_1+N_2$ is not greater than N. The barrier layers of the $N_1$ quantum-well structure periods of the first light-emitting section have an average bandgap less than that of the $N_2$ quantum-well structure periods of the second light-emitting section. The well layer of the $N_1$ quantum-well structure periods of the first light-emitting section has an average bandgap that is not less than that of the $N_2$ quantum-well structure periods of the second light-emitting section. Each of the $N_2$ quantum-well structure periods of the second light-emitting section sequentially has a first barrier layer, a second barrier layer, a third barrier layer, the well layer, and a forth barrier layer. The second barrier layer has a bandgap that is greater than those of the first barrier layer and the third barrier layer. The forth barrier layer has a bandgap greater than that of the second barrier layer.

According to a second aspect of the disclosure, a method for producing the aforesaid light-emitting structure includes the following steps: (a) providing a substrate; (b) forming a nucleation layer on the substrate; and (c) forming the n-type layer, the active layer, and the p-type layer in such order on the nucleation layer.

According to a third aspect of the disclosure, a light-emitting device includes a substrate and the aforesaid light-emitting structure formed on the substrate.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
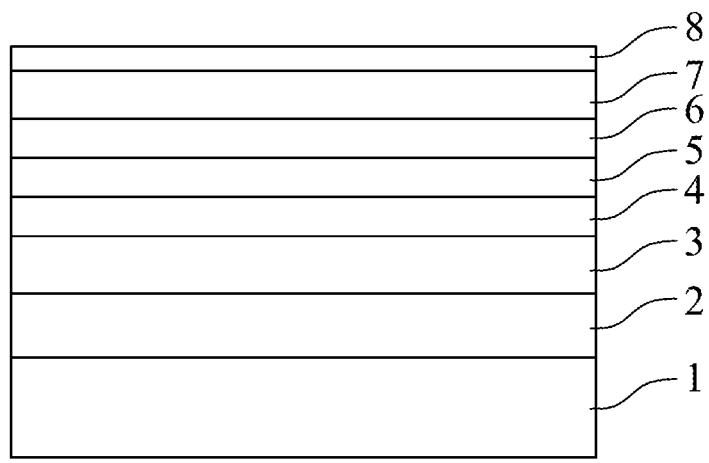
FIG. 1 is a schematic view illustrating a light-emitting structure of a first embodiment according to the present disclosure.

Before the disclosure is described in greater detail, it should be noted that where considered appropriate, reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated degrees or at other orientations) and the spatially relative terms used herein may be interpreted accordingly.

The light-emitting structure of the present disclosure is configured as a light-emitting epitaxial structure.

First Embodiment

Referring to FIG. 1, a light-emitting structure of the first embodiment according to the present disclosure is formed on a substrate 1. The light-emitting structure of the first embodiment includes an un-doped gallium nitride (u-GaN) layer 2, an re-type layer 3, a stress releasing layer 4, an active layer, and a p-type layer 8 that are disposed on the substrate 1 in such order. In this embodiment, the n-type layer 3 is formed as an n-doped gallium nitride (n-GaN) layer.

The active layer includes N quantum-well structure periods. Each of the N quantum-well structure periods has a well layer and at least one barrier layer. The N quantum-well structure periods include $N_1$ quantum-well structure periods that defines a first light-emitting section 5, $N_2$ quantum-well structure periods that defines a second light-emitting section 7, and $N_3$ quantum-well structure periods that defines a third light-emitting section 6. It should be noted that, in this embodiment, the quantum-well structure periods are referred as the number of the quantum-well structures. In this embodiment, each of $N_1$, $N_2$, and $N_3$ ranges from 1 to 5. The first light-emitting section 5 is closer to the n-type layer 3 than the second light-emitting section 7, and the third light-emitting section 6 is interposed between the first light-emitting section 5 and the second light-emitting section 7. Each of $N_1$, $N_2$, and $N_3$ is greater than or equal to 1, and $N_1+N_2$ is not greater than N.

Figure 2:
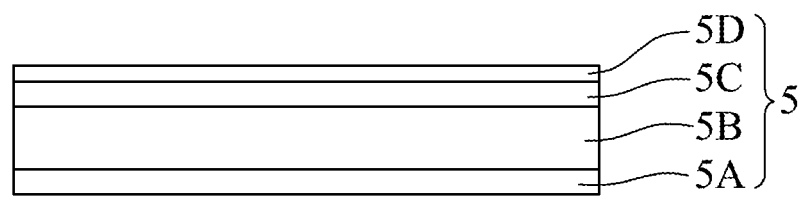
FIG. 2 is a schematic view illustrating a first light-emitting section of the first embodiment.

Referring to FIG. 2, each of the $N_1$ quantum-well structure periods of the first light-emitting section 5 sequentially has a first barrier layer 5A, a second barrier layer 5B, a third barrier layer 5C, and the well layer 5D. In this embodiment, in each of the $N_1$ quantum-well structure periods of the first light-emitting section 5, the second barrier layer 5B has a bandgap greater than those of the first barrier layer 5A and the third barrier layer 5C.

Figure 3:
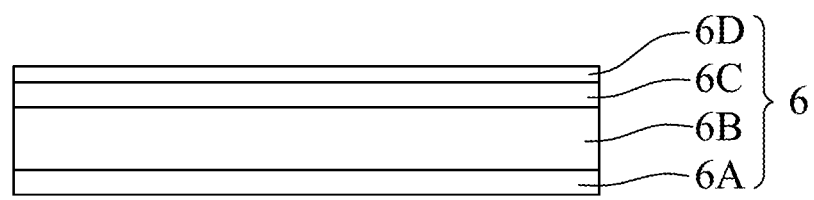
FIG. 3 is a schematic view illustrating a third light-emitting section of the first embodiment.

Referring to FIG. 3, each of the $N_3$ quantum-well structure periods of the third light-emitting section 6 sequentially has a first barrier layer 6A, a second barrier layer 6B, a third barrier layer 6C, and a well layer 6D. In this embodiment, in each of the $N_3$ quantum-well structure periods of the third light-emitting section 6, the second barrier layer 6B has a bandgap greater than those of the first barrier layer 6A and the third barrier layer 6C.

Figure 4:
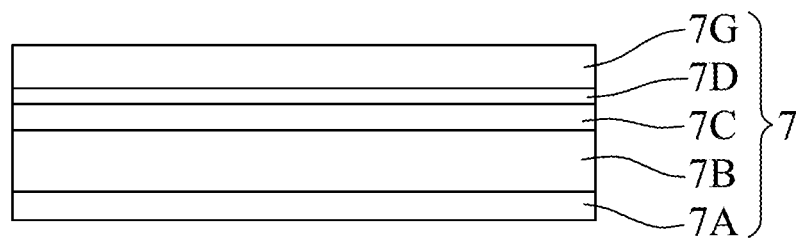
FIG. 4 is a schematic view illustrating a second light-emitting section of the first embodiment.

Referring to FIG. 4, each of the $N_2$ quantum-well structure periods of the second light-emitting section 7 sequentially has a first barrier layer 7A, a second barrier layer 7B, a third barrier layer 7C, the well layer 7D, and a forth barrier layer 7G. In this embodiment, in each of the $N_2$ quantum-well structure periods of the second light-emitting section 7, the second barrier layer 7B has a bandgap greater than those of the first barrier layer 7A and the third barrier layer 7C, and the forth barrier layer 7G has a bandgap greater than that of the second barrier layer 7B.

Figure 5:
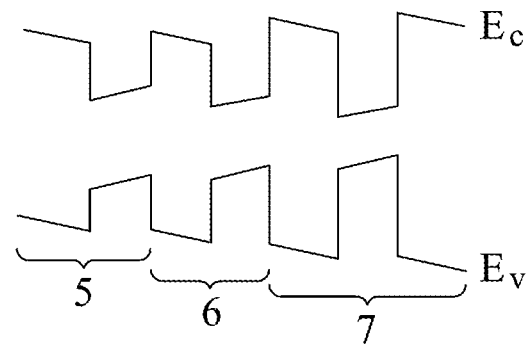
FIG. 5 is a schematic view illustrating a bandgap structure of an active layer of the first embodiment.

Referring to FIG. 5, the first, second and third barrier layers 5A, 5B, 5C of the $N_1$ quantum-well structure periods of the first light-emitting section 5 has an average bandgap less than that of the $N_2$ quantum-well structure periods of the second light-emitting section 7. The first, second and third barrier layers 7A, 7B, 7C of the $N_3$ quantum-well structure periods of the third light-emitting section 7 have an average bandgap greater than that of the $N_1$ quantum-well structure periods of the first light-emitting section 5, and is less than that of the N2 quantum-well structure periods of the second light-emitting section 7. The well layer 5D of the $N_1$ quantum-well structure periods of the first light-emitting section 5 has an average bandgap that is not less than the well layer 7D of the $N_2$ quantum-well structure periods of the second light-emitting section 7. The well layers of the $N_3$ quantum-well structure periods of the third light-emitting section 6 have an average bandgap greater than that of the $N_2$ quantum-well structure periods of the second light-emitting section 7, and is less than that of the $N_1$ quantum-well structure periods of the first light-emitting section 5.

In this embodiment, in each of the N quantum-well structure periods, each of the first 5A, 6A, 7A, second 5B, 6B, 7B, third 5C, 6C, 7C, and forth 7G barrier layers has a thickness ranging from 10 Å to 1000 Å; and the well layer 5D, 6D, 7D has a thickness ranging from 1 Å to 100 Å. Furthermore, the second barrier layer 5B, 6B, 7B of each of the N quantum-well structure periods has a thickness greater than those of the first barrier layer 5A, 6A, 7A and the third barrier layer 5C, 6C, 7C.

Each of the N quantum-well structure periods has a ratio of a total thickness of the first 5A, 6A, 7A, second 5B, 6B, 7B, and third 5C, 6C, 7C barrier layers to the thickness of the well layer 5D, 6D, 7D ranging from 5:1 to 20:1. Furthermore, each of the $N_2$ quantum-well structure periods of the second light-emitting section 7 has a ratio of a total thickness of the forth barrier layer 7G to the thickness of the well layer 7D ranging from 5:1 to 20:1.

In each of the $N_2$ quantum-well structure periods of the second light-emitting section 7, the thickness of the forth barrier layer 7G is greater than those of the first barrier layer 7A and the third barrier layer 7C.

Each of the first 5A, 6A, 7A, second 5B, 6B, 7B and third 5C, 6C, 7C barrier layers of each of the $N_1$ quantum-well structure periods of the first light-emitting section 5, the $N_3$ quantum-well structure periods of the third light-emitting section 6, and the $N_2$ quantum-well structure periods of the second light-emitting section 7 is an n-type doped layer. The n-type doping layer has an n-type doping concentration ranging from $1\times10^{-7}/cm^3$ to $1\times10^{19}/cm^3$. Furthermore, the forth barrier layer 7G of each of $N_2$ quantum-well structure periods of the second light-emitting section 7 is an unintentionally doped layer.

The well layer 5D, 6D, 7D of each of the N quantum-well structure periods is made of $Al_xIn_yGa_{1-x-y}N$. Each of the first 5A, 6A, 7A, second 5B, 6B, 7B and third 5C, 6C, 7C barrier layers of each of the N quantum-well structure periods and the forth barrier layer 7G of each of the $N_2$ quantum-well structure periods of the second light-emitting section 7 are made of $Al_pIn_qGa_{1-p-q}N$, where $0 \leq x < p < 1$, and $0 \leq q < y < 1$.

A method for producing the light-emitting structure shown in the FIGS. 1 to 5 is described below. The method includes the following steps S1 to S5:

In step S1, a substrate 1 is provided. The substrate 1 may be, including but not limited to, a sapphire ($Al_2O_3$) substrate, an aluminum nitride (AlN)-coated sapphire ($Al_2O_3$) substrate, a silicon nitride ($SiN_x$)-coated sapphire ($Al_2O_3$) substrate, a gallium oxide ($Ga_2O_3$) substrate, an AlN-coated $Ga_2O_3$ substrate, a $SiN_x$-coated $Ga_2O_3$ substrate, a silicon carbide (SiC) substrate, a gallium nitride (GaN) substrate, a zinc oxide (ZnO) substrate, a silicon substrate, or a germanium substrate, etc. In this embodiment, the substrate 1 is an AlN-coated sapphire substrate.

In step S2, a material (e.g. aluminum gallium nitride) is deposited on the substrate 1 to form a nucleation layer (not shown in the figures) by an epitaxial process. The epitaxial process may be metalorganic chemical vapor deposition (MOCVD), molecular beam epitaxy (MBE), chemical vapor deposition (CVD), hydride vapor phase epitaxy (HVPE), plasma-enhanced chemical vapor deposition (PECVD), etc., but is not limited to thus. In this embodiment, the nucleation layer is formed by the MOCVD.

It should be noted that, in this step, the substrate 1 (i.e. AlN-coated sapphire substrate) is placed in the metalorganic chemical vapor deposition chamber. A hydrogenation treatment is performed to remove impurities from a surface of the substrate 1. Then, the chamber is reduced to be from about 500° C. to about 600° C., and aluminum gallium nitride is deposited on the substrate 1 to form the nucleation layer that has a thickness of about 20 nm.

In step S3, the u-GaN layer 2 and the n-type layer 3 are sequentially formed on the nucleation layer.

It should be noted that, a relatively large difference of lattice constants between the substrate 1 and the n-type layer 3 might cause lattice mismatch to occur therebetween. If the lattice mismatch is obvious, a crystal quality of the semiconductor layer (i.e. the n-type layer 3) may be adversely affected. Therefore, the u-GaN layer 2 is used to reduce the lattice mismatch, so as to enhance crystal quality of the n-type layer 3. In addition, in this embodiment, formation of the u-GaN layer 2 involves an epitaxial growth process in a three-dimensional mode and a two-dimensional mode. On the basis of the nucleation layer, the u-GaN layer is formed into an island-like structure in the three-dimensional mode so as to maximize the turning and merging of dislocations between the nucleation layer and the u-GaN layer 2. Then, the epitaxial growth process of the u-GaN layer 2 is turned to the two-dimensional mode to form a flattened surface. The u-GaN layer 2 as grown, has a thickness ranging from 1 μm to 3 μm. Then, n-GaN is deposited on the u-GaN layer 2 to form the n-type layer 3. In this embodiment, the n-type layer 3 is an N—GaN layer and has a thickness ranging from 1 μm to 3 μm, and a doping concentration ranging from $1 \times 10^{19}/cm^3$ to $2.5 \times 10^{19}/cm^3$.

In step S4, the stress release layer 4 is deposited on the n-type layer 3. In this embodiment, the temperature is reduced to a range of 750° C. to 950° C. The stress release layer 4 is formed by alternately depositing indium gallium nitride and gallium nitride to form a super lattice structure layer or form another combination structure. Consequently, a mismatch between the stress release layer 4 and the subsequently formed active layer that has a relatively high indium content and between the stress release layer 4 and the N—GaN layer (the n-type layer 3) is reduce, the stress is released and the lattice quality is enhanced.

In step S5, the first light-emitting section 5 of the active layer is formed on the stress releasing layer 4.

It should be noted that, in this embodiment, the temperature is raised to a barrier-layer forming temperature ranging from 800° C. to 900° C. The first barrier layer 5A may be made of gallium nitride-based materials. In this embodiment, the first barrier layer 5A is made of Silicon (Si)-doped gallium nitride and deposited on the stress releasing layer in such temperature with a growth rate of about 0.9 Å/s. The first barrier layer 5A as formed has a thickness ranging from about 5 Å to about 50 Å, and a silicon doping concentration ranging from about $1 \times 10^{17}/cm^3$ to about $1 \times 10^{19}/cm^3$.

Thereafter, the second barrier layer 5B is deposited on the first barrier layer 5A. The second barrier layer 5B may be made of aluminum gallium nitride-based materials. In this embodiment, the second barrier layer 5B is made of Si-doped aluminum gallium nitride and formed at the previous temperature raised by 10° C. to 50° C., at a growth rate of about 1.5 Å/s. The second barrier layer 5B as formed has the thickness ranging from about 30 Å to about 100 Å, a relative content of aluminum ranging from about 1% to about 10% (preferably, 1.5%), and a silicon doping concentration ranging from about $1 \times 10^{17}/cm^3$ to about $1 \times 10^{19}/cm^3$. During formation of the second barrier layers 5B, a trimethylaluminum (TMAL) gas of 2 sccm is introduced.

After the second barrier layer 5B is formed, introduction of TMAL gas is stopped. Then, the third barrier layer 5C is deposited on the second barrier layer 5B. The third barrier layer 5C may be made of gallium nitride-based materials. In this embodiment, the third barrier layer 5C is made of silicon-doped gallium nitride and formed at the previous temperature reduced by 10° C. to 50° C. and at a growth rate of about 0.9 Å/s. The third barrier layer 5C as formed has the thickness ranging from about 5 Å to about 50 Å, and a silicon doping concentration ranging from about $1 \times 10^{17}/cm^3$ to about $1 \times 10^{19}/cm^3$. During formation of the third barrier layer 5C, a $SiH_4$ gas is introduced.

Then, the well layer 5D is deposited on the third barrier layer 5C, introduction of the $SiH_4$ gas is stopped. In this embodiment, the well layer 5D made of indium gallium nitride is formed at the temperature reduced to a range of 700° C. to 800° C. at a growth rate of about 0.3 Å/s. The well layer 5D as formed has the thickness ranging from 5 Å to 50 Å (in certain embodiments, 20 Å) and an average indium content that is about 18%. During the formation of the well layer 5D, a trimethylindium (TMIN) gas of 800 sccm is introduced.

In this step S5, formation of each the quantum well structure periods of the first light-emitting section 5, i.e., formation of the first, second, and third barrier layers 5A, 5B, 5C, and the well layer 5D, may be repetitively performed 1 to 5 times, thereby obtaining the first light-emitting section 5 that has the $N_1$ quantum-well structure periods, where $N_1$ ranges from 1 to 5. In addition, the $N_1$ quantum-well structure periods may each have the same composition.

In this embodiment, the $N_1$ is two. The bandgap of the second barrier layer 5B is not less than or equal to those of the first barrier layer 5A and the third barrier layer 5C, thereby suppressing a carrier overflow effectively to adjust a bandgap configuration of the active layer. Moreover, in order to enhance the manufacturing efficiency and improve the lattice quality of the active layer, the temperature and the growth rate are adjustably adapted for the formation of different barrier layers, i.e., the temperature and the growth rate are different in each process for forming the first, second, and third barrier layers 5A, 5B, 5C.

In step S6, the third light-emitting section 6 is formed on the first light-emitting section 5 opposite to the stress releasing layer 4.

It should be noted that, in this embodiment, the temperature is raised to a range of 800° C. to 900° C. Then, the first barrier layer 6A made of gallium nitride is deposited on the first light-emitting section 5 at a growth rate of about 0.6 Å/s. The first barrier layer 6A is an unintentionally doped layer and has a thickness ranging from about 5 Å to about 50 Å.

Then, the second barrier layer 6B is deposited on the first barrier layer 6A. The second barrier layer 6B may be made of aluminum gallium nitride-based materials. In this embodiment, the second barrier layer 6B is made of Si-doped aluminum gallium nitride and formed at the previous temperature increased by 10° C. to 50° C. and at a growth rate of about 0.9 Å/s. The second barrier layer 6B as formed has the thickness ranging from about 30 Å to about 100 Å, a relative content of aluminum ranging from about 1% to about 10% (preferably, 2%), and a silicon doping concentration ranging from about $1\times10^{17}/cm^3$ to about $1\times10^{19}/cm^3$. During formation of the second barrier layer 6B, the TMAL gas of 2.5 sccm is introduced.

Then, the third barrier layer 6C is deposited on the second barrier layer 6B, and introduction of the TMAL gas is stopped. The third barrier layer 6C may be made of gallium nitride-based materials. In this embodiment, the third barrier layer 6C is made of Si-doped gallium nitride and formed at the previous temperature reduced by 10° C. to 50° C. and at a growth rate of about 0.6 Å/s. The third barrier layer 6C as formed has the thickness ranging from about 5 Å to about 50 Å and a silicon doping concentration ranging from about $1\times10^{17}/cm^3$ to about $1\times10^{19}/cm^3$. During formation of the third barrier layer 6C, a $SiH_4$ gas is introduced.

After the third barrier layer 6C is formed, introduction of the $SiH_4$ gas is stopped, and the temperature is reduced to a range of 700° C. to 800° C. The well layer 6D made of indium gallium nitride is deposited on the third barrier layer 6C at a growth rate of about 0.2 Å/s. The well layer 6D as formed has the thickness ranging from about 5 Å to about 50 Å (in certain embodiments, 20 Å) and an average indium content that is about 19%. During formation of the well layer 6D, the TITIN gas of 900 sccm is introduced.

In this step, formation of each the quantum well structure periods of the second light-emitting section 6, i.e., formation of the first, second, and third barrier layers 6A, 6B, 6C, and the well layer 6D, may be repetitively performed 1 to 5 times, thereby obtaining the third light-emitting section 6 that has the $N_3$ quantum-well structure periods, where $N_3$ ranges from 1 to 5. In addition, the $N_3$ quantum-well structure periods may each have the same composition.

In this embodiment, the $N_3$ is two. The average bandgap of the first, second and third barrier layers 6A, 6B, 6C of the $N_3$ quantum-well structure periods of the third light-emitting section is greater than that of the $N_1$ quantum-well structure periods of the first light-emitting section 5; and the average bandgap of the well layers of the $N_3$ quantum-well structure periods of the third light-emitting section 6 is less than that of the $N_1$ quantum-well structure periods of the first light-emitting section 5, so that the carrier overflow in the third light-emitting section 6 that is relatively close to the p-type layer 8 than the first light-emitting section 5 can be suppressed effectively, thus a carrier transport and a recombination effect in a low injection current can be improved. In addition, the first, second and third barrier layers 6A, 6B, 6C of the third light-emitting section 6 are grown at the growth rate that is less than or equal to that of the first, second and third barrier layers 5A, 5B, 5C of the first light-emitting section 5, and the well layer 6D of the third light-emitting section 6 is grown at the growth rate that is less than or equal to that of the well layer 5D of the first light-emitting section 5, so that the third light-emitting section 6 may have superior lattice quality.

In step 7, the second light-emitting section 7 is formed on the third light-emitting section 6 opposite to the first light-emitting section 5.

In this embodiment, the temperature is raised to a range of 800° C. to 900° C. Then, the first barrier layer 7A made of gallium nitride is deposited on the third light-emitting section 6 at a growth rate of about 0.3 Å/s. In this embodiment, the first barrier layer 7A is an unintentionally doped layer, and has the thickness ranging from about 5 Å to about 50 Å.

Then, the second barrier layer 7B is deposited on the first barrier layer 7A. The second barrier layer 7B may be made of aluminum gallium nitride-based materials. In this embodiment, the second barrier layer 7B is made of Si-doped aluminum gallium nitride and formed at the temperature raised by 10° C. to 50° C. at a growth rate of about 0.5 Å/s. The second barrier layer 7B as formed has a thickness ranging from about 30 Å to about 100 Å, a relative content of aluminum ranging from about 1% to about 10 (preferably 2.5%), and a silicon doping concentration ranging from about $1\times10^{17}/cm^3$ to about $1\times10^{19}/cm^3$. During formation of the second barrier layer 7B, the TMAL gas of 3 sccm is introduced.

Then, the third barrier layer 7C is deposited on the second barrier layer 7B, and introduction of the TMAL gas is stopped. The third barrier layer 7C may be made of gallium nitride-based materials. In this embodiment, the third barrier layer 7C is made of Si-doped gallium nitride and formed at the previous temperature reduced by 10° C. to 50° C. at a growth rate of about 0.3 Å/s. The third barrier layer 7C as formed has the thickness ranging from about 5 Å to about 50 Å.

After the third barrier layer 7C is formed, the temperature is reduced to a range of 700° C. to 800° C. The well layer 7D made of indium gallium nitride is deposited on the third barrier layer 7C at a growth rate of about 0.1 Å/s. The well layer 7D as formed has a thickness ranging from 5 Å to 50 Å (in certain embodiments, 20 Å), and an average indium content that is about 20%. During formation of the well layer 7D, the TMIN gas of 1000 sccm is introduced.

After the well layer 7D is formed, the temperature is raised to the range of 800° C. to 900° C. Then, the forth barrier layer 7G made of gallium nitride and aluminum gallium nitride is deposited on the well layer 7D at a growth rate of 0.5 Å/s. The forth barrier layer 7G has a thickness ranging from about 50 Å to about 100 Å and a relative content of aluminum ranging from about 5 to about 50% (preferably, 15%).

In this step, formation of each of the quantum well structure periods of the second light-emitting section 7, i.e., formation of the first, second, third barrier layer 7A, 7B, 7C, the well layer 7D, and the forth barrier layer 7G, may be repetitively performed 1 to 5 times, thereby obtaining the second light-emitting section 7 that has the $N_2$ quantum-well structure periods, where $N_2$ ranges from 1 to 5. In addition, the $N_2$ quantum-well structure periods may each have the same composition. In this embodiment, the $N_2$ is 1.

Referring to FIG. 5, the average bandgap of the first, second, third and fourth barrier layers 7A, 7B, 7C, 7G of the second light-emitting section 7 is greater than the first, second and third barrier layers 6A, 6B, 6C of the third light-emitting section 6 and the first light-emitting section 5; and the average bandgap of the well layers 7D of the second light-emitting section 7 is less than those of the third light-emitting section 6 and the first light-emitting section 5. Furthermore, the bandgap of the forth barrier layer 7G is greater than or equal to those of the first 7A, second 7B, and third 7C barrier layers, so that the carrier overflow can be effectively suppressed, and the carrier transport and the recombination effect in the low injection current can be improved.

In this embodiment, the barrier layers 5A, 5B, 5C of the first light-emitting section 5 are grown at an average growth rate greater than that of the barrier layers 7A, 7B, 7C, 7G of the second light-emitting section 7. In each of the N quantum-well structure periods, either of the first barrier layer and the third barrier layer are grown at an average growth rate not greater than that of the second barrier layer. The well layer 7D of the second light-emitting section 7 be grown at an average growth rate of not greater than those of the first light-emitting section 5 and third light-emitting section 6. Therefore, the second light-emitting section 7 that is relatively close to the p-type layer 8 than the first light-emitting section 5 and the third light-emitting section 6 may be formed at a relatively low growth rate, so as to obtain a superior lattice quality, thus the carrier overflow can be suppressed effectively, and the carrier transport, the recombination effect, and the light-emitting efficiency in the low injection current can be improved.

Thus, the active layer of the embodiment may be obtained. In such configuration of the active layer, recombination efficiency and injection efficiency of the carriers may be enhanced, the carrier overflow may be suppressed effectively, and wavelength overlapping of the electrons and holes may be increased, thus the carrier transport and the recombination effect in the low injection current can be improved. It should be noted that, the active layer is configured to have a plurality of the light-emitting sections (i.e. the first, second, and third light-emitting sections 5, 6, 7) that are made at different growth rates and have different thicknesses respectively, thereby reducing the lattice mismatch between the active layer and the bottom layer, or between the well layers and the barrier layers of the active layer, reducing the stress to improve the crystal quality of the active layer, so that a peak value efficiency reach at low current density to enhance the light-emitting efficiency at low current.

In step 8, the p-type layer 8 is formed on the active layer (i.e. the second light-emitting section 7).

In certain embodiments, the p-type layer 8 may be configured to have a low-temperature p-type layer, a high-temperature p-doped aluminum gallium nitride (p-AlGaN) layer, and a high-temperature p-doped gallium nitride (p-GaN) layer (none of which are shown in the figures). The low-temperature p-type layer is used to ensure the active layer not to be damaged by the high temperature, and to provide improved hole injection efficiency. Furthermore, after the low-temperature p-type layer is formed, the temperature is raised to grow the high-temperature p-AlGaN layer and the high-temperature p-GaN layer to planarize a surface of the low-temperature p-type layer.

Thus, the light-emitting structure of the first embodiment of the present disclosure may be obtained. In some embodiments, the light-emitting structure of the first embodiment may be used to produce a micro light-emitting diode chip that has a horizontal area of 19×31 μm², but is not limited to thus.

Second Embodiment

The light-emitting structure of the second embodiment according to the present disclosure is generally similar to that of the first embodiment, except for the configuration of the active layer.

Figure 6:
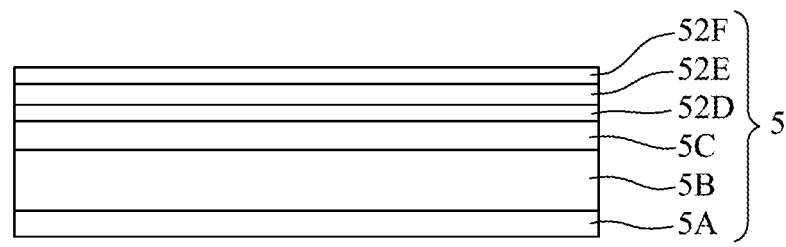
FIG. 6 is a schematic view illustrating a first light-emitting section of a light-emitting structure of a second embodiment according to the present disclosure.

Referring to FIG. 6, each of the $N_1$ quantum-well structure periods of the first light-emitting section 5 sequentially has the first barrier layer 5A, the second barrier layer 5B, the third barrier layer 5C, a first well layer 52D, a second well layer 52E, and a third well layer 52F.

Figure 7:
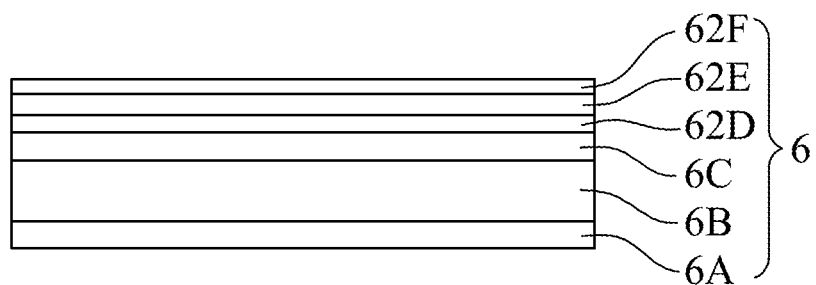
FIG. 7 is a schematic view illustrating a third light-emitting section of the second embodiment.

Referring to FIG. 7, each of the $N_3$ quantum-well structure periods of the third light-emitting section 6 sequentially has the first barrier layer 6A, the second barrier layer 6B, the third barrier layer 6C, a first well layer 62D, a second well layer 62E, and a third well layer 62F.

Figure 8:
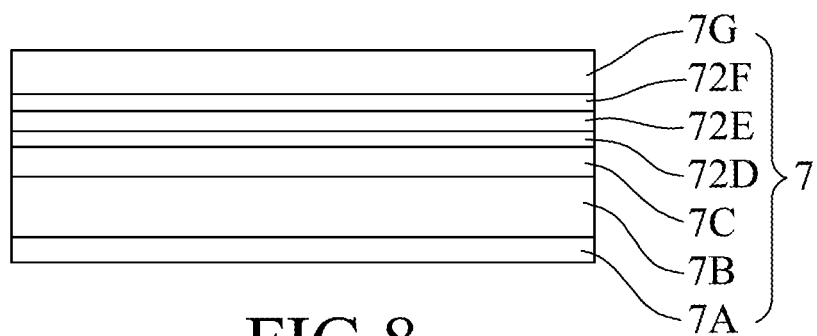
FIG. 8 is a schematic view illustrating the second light-emitting section of the second embodiment.

Referring to FIG. 8, each of the $N_2$ quantum-well structure periods of the second light-emitting section 7 sequentially has the first barrier layer 7A, the second barrier layer 7B, the third barrier layer 7C, a first well layer 72D, a second well layer 72E, a third well layer 72F, and the forth barrier layer 72G.

The method for producing the light-emitting structure of the second embodiment is generally similar to that of the first embodiment, except for the following differences.

Referring to FIG. 6, in the step S5 that is for forming the first light-emitting section 5, after the third barrier layer 5C is formed, the well layer-forming temperature is reduced to a range of 700° C. to 800° C. In the process of reducing the temperature, the first well layer 52D begins to be formed at a growth rate of about 0.6 Å/s, in this embodiment, the first well layer 52D is an indium gallium nitride layer, and has a thickness ranging from about 3 Å to about 8 Å. During the process for forming the first well layer 52D, the TMIN gas of 1000 sccm is introduced.

After the first well layer 52D is formed, the second well layer 52E is formed on the first well layer 52D at a growth rate of about 0.3 Å/s, in this embodiment, the second well layer 52E is an indium gallium nitride layer and has a thickness ranging from about 5 Å to about 15 Å.

After the second well layer 52E is formed, the barrier layer-forming temperature is raised to a range of 700° C. to 800° C. In the process of raising the temperature, the third well layer 52F begins to be formed at a growth rate of about 0.6 Å/s, in this embodiment, the third well layer 52F is an indium gallium nitride layer, and has a thickness ranging from about 3 Å to about 8 Å and the average indium content that is about 20%.

Referring to FIG. 7, in the step S6 that is for forming the third light-emitting section 6, after the third barrier layer 6C is formed, the well-layer forming temperature is reduced to a range of 700° C. to 800° C. In the process of reducing the temperature, the first well layer 62D begins to be formed at a growth rate of about 0.4 Å/s, in this embodiment, the first well layer 62D is an indium gallium nitride layer, and has a thickness ranging from about 3 Å to about 8 Å. During the process for forming the first well layer 62D, the TMIN gas of 1000 sccm is introduced.

After the first well layer 62D is formed, the second barrier layer 62E is formed on the first well layer 62D at a growth rate of about 0.2 Å/s, in this embodiment, the second barrier layer 62E is an indium gallium nitride layer, and has a thickness ranging from about 5 Å to about 15 Å.

After the second barrier layer 62E is formed, the barrier layer-forming temperature is raised to a range of 700° C. to 800° C. (i.e., the temperature of the barrier layer). In the process of raising the temperature, the third well layer 62F is begun to be formed at a growth rate of about 0.4 Å/s, in this embodiment, the third well layer 62F is an indium gallium nitride layer, and has the thickness ranging from about 3 Å to about 8 Å and the average indium content that is about 20%.

Referring to FIG. 8, in the step S7 that is for forming the second light-emitting section 7, after the third barrier layer 7C is formed, the well laver-forming temperature is reduced to a range of 700° C. to 800° C. In the process of reducing the temperature, the first well layer 72D begins to be formed at a growth rate of about 0.2 Å/s, in this embodiment, the first well layer 72D is an indium gallium nitride layer, and has a thickness ranging from about 3 Å to about 8 Å. During the process for forming the first well layer 72D, the TMIN gas of 1000 sccm is introduced.

After the first well layer 72D is formed, the second well layer 72E is formed on the first well layer 72D at a growth rate of about 0.1 Å/s, in this embodiment, the second well layer 72E is an indium gallium nitride layer, and has a thickness ranging from about 5 Å to about 15 Å.

After the second well layer 72E is formed, the barrier layer-forming temperature is raised to a range of 700° C. to 800° C. In the process of raising the temperature, the third well layer 72F begins to be formed at a growth rate of about 0.1 Å/s, in this embodiment, the third well layer 72F is an indium gallium nitride layer, and has a thickness ranging from about 3 Å to about 8 Å and the average indium content that is about 20%. After the third well layer 72F is formed, the forth barrier layer 7G is formed on the third well layer 72F.

The light-emitting structure of the second embodiment is formed to have multiple well layers, so that the lattice mismatch stress between the well layers having high indium content and the barrier layers can be further reduced. Moreover, in order to improve the lattice mismatch stress between the well layers and the barrier layers in each of the N of quantum-well structure periods, the lattice quality of the active layer, and the performance of the light-emitting device that has the light-emitting structure of the second embodiment at low current, the temperature and the growth rate may be adjusted according to the different well layers, thus the temperature and the growth rate are different in each processes for forming the well layers.

Third Embodiment

The light-emitting structure of the third embodiment according to the present disclosure is generally similar to that of the first embodiment, except for the following differences.

The active layer does not include the third light-emitting section 6, i.e., the active layer only includes the first light-emitting section 5 and the second light-emitting section 7. In this case, the sum of the $N_1$ and the $N_2$ is equal to N (i.e., $N_1+N_2=N$).

Forth Embodiment

The light-emitting structure of the forth embodiment according to the present disclosure is generally similar to that of the first embodiment, except for the following differences.

In the second light-emitting section 7, the forth barrier layer 7G may be formed as a single layer that is made of a material that is a combination of gallium nitride, aluminum gallium nitride, and aluminum nitride. Furthermore, the forth barrier layer 7G may also be formed as a laminated structure that has a gallium nitride layer, an aluminum gallium nitride layer, and an aluminum nitride layer, for instance, the laminated structure may be formed as a gallium nitride layer/aluminum gallium nitride layer/aluminum nitride layer structure that is repeated N times, or a gallium nitride layer/aluminum gallium nitride layer structure that is repeated N times, where $1 \leq N \leq 20$, and the aluminum content ranges from 5% to 20%. In such configuration, the carrier overflow may be further suppressed, and the wavelength overlapping between electrons and holes may be increased, thus the recombination effect at low current can be improved, and the brightness at low current can be enhanced.

Fifth Embodiment

The present disclosure also provides the light emitting device that has the substrate 1 AND the aforesaid light-emitting structure formed on the substrate 1. In this embodiment, the light-emitting device has a horizontal area ranging from $1 \times 1$ μm$^2$ to $300 \times 300$ μm$^2$.

Figure 9:
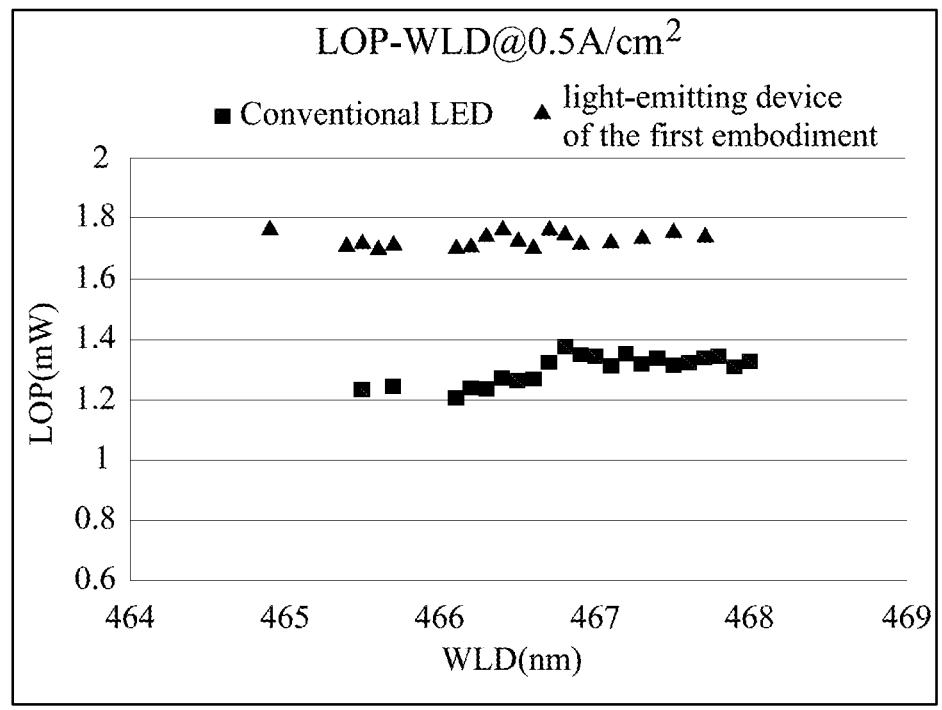
FIG. 9 is a light output power (LOP) vs. wavelength (WLD) plot, illustrating a comparison between a light-emitting device of the present disclosure and a conventional light-emitting diode at a current density of 0.5 A/cm$^2$.
Figure 10:
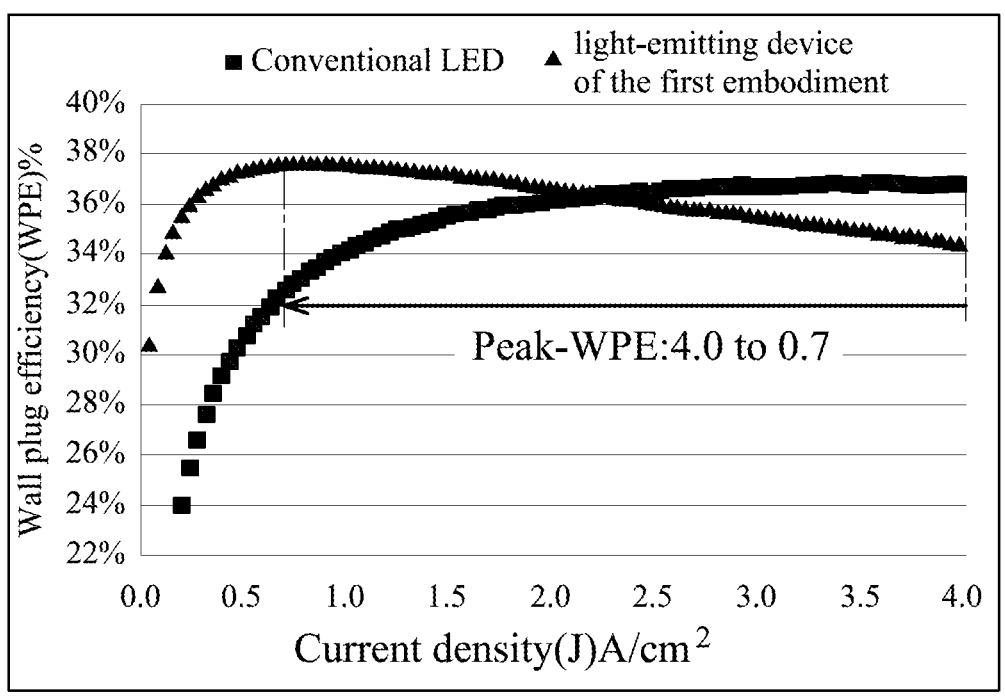
FIG. 10 is a photoelectric conversion efficiency vs. current density plot illustrating a comparison between the light-emitting device of the present disclosure and the conventional light-emitting diode.
Figure 11:
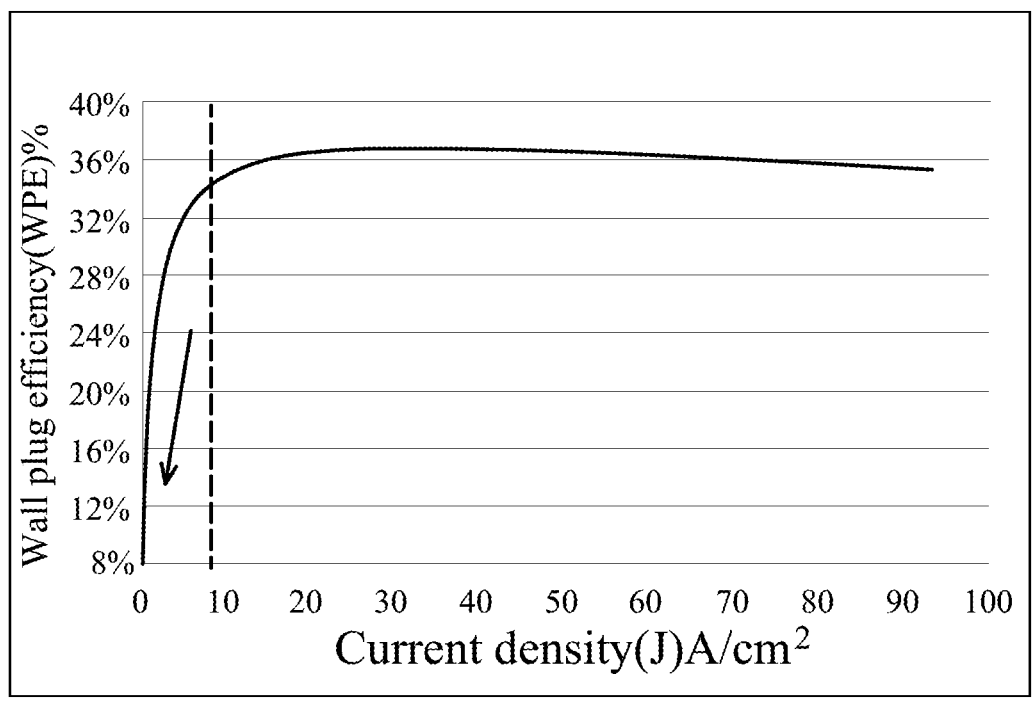
FIG. 11 is a photoelectric conversion efficiency vs. current density plot of a light-emitting epitaxial structure of a conventional light-emitting diode.

FIGS. 9 and 10 show a comparison between the light-emitting device of the first embodiment and the conventional light-emitting diode. As shown in the FIG. 9, the vertical axis represents a light output power (LOP); and the horizontal axis represents a wavelength (WLD). As a results, the LOP of the light-emitting device of the present disclosure is greater than that of the conventional light-emitting diode by about 30% at a current density of 0.5 A/cm$^2$.

As shown in the FIG. 10, the horizontal axis represents the current density (J); and the vertical axis represents a wall plug efficiency (WPE). As a result, the peak value of the wall plug efficiency (peak-WPE) is reduced from 4 A/cm$^2$ to 0.7 A/cm$^2$.

In other embodiments, one or more the aforesaid light-emitting devices are applicable to make a light-emitting apparatus.

In summary, the light-emitting structure, the light-emitting device, and the production method of the light-emitting structure of the present disclosure have the following advantages:

1. By virtue of the active layer that has a plurality of the light-emitting sections, the carrier overflow in the light-emitting sections can be suppressed effectively, the wavelength overlapping of the electrons and holes can be increased, and the stress in the light-emitting sections can be released effectively, thus the carrier transport and the recombination effect at low injection current can be improved, and a radiative recombination efficiency of the carrier and the photoelectric conversion efficiency can be enhanced.

2. Since each of the light-emitting sections has the relatively thin well layer and the relatively thick barrier layers, and further has a greater ratio of the thickness of the well layer to the barrier layers, growth defect density in the multi quantum well can be reduced, growth quality of the multi quantum well can be noticeably improved, and non-radiative recombination efficiency can be reduced. Therefore, the peak value of the wall plug efficiency would noticeably increase.

3. By virtue of the light-emitting sections that are grown by the different growth rates, the lattice mismatch stress between the well layer and the barrier layers of the active layer can be further improved, and the lattice quality of the active layer can be improved.

It should be noted that, for a micro light-emitting device, a main active layer is referred to as an active layer that is closer to the p-type layer. Therefore, by growing the first light-emitting section 5 that is closer to the n-type layer 4 at a relatively high growth rate; and growing the second light-emitting section 7 that is closer to the p-type layer at a relatively low growth rate, the lattice mismatch stress between a part of the active layer that has the high indium content and the gallium nitride layer can be further reduced. Thus, the lattice quality of the active layer of the micro light-emitting device can be effectively improved, a relatively short growth time can be obtained to enhance the production efficiency.

4. In each the quantum well structure periods, by adjusting the temperature and the growth rate to form the different well layers and different barrier layers, the lattice mismatch stress between the barrier layers and the well layer in each quantum well structure can be improved, thus the lattice quality of the multi quantum well can be improved.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what is considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting structure, comprising:
an n-type layer;
an active layer disposed on said n-type layer and having N quantum-well structure periods, each of said N quantum-well structure periods having a well layer and at least one barrier layer; and
a p-type layer disposed on said active layer and opposite to said n-type layer,
wherein said N quantum-well structure periods include $N_1$ quantum-well structure periods that defines a first light-emitting section, and $N_2$ quantum-well structure periods that defines a second light-emitting section, said first light-emitting section being closer to said n-type layer than said second light-emitting section, either of $N_1$ and $N_2$ being not less than 1, $N_1+N_2$ being not greater than N;
wherein said barrier layers of said $N_1$ quantum-well structure periods of said first light-emitting section having an average bandgap less than that of said $N_2$ quantum-well structure periods of said second light-emitting section, said well layer of said $N_1$ quantum-well structure periods of said first light-emitting section having an average bandgap being not less than that of said $N_2$ quantum-well structure periods of said second light-emitting section; and
wherein each of said $N_2$ quantum-well structure periods of said second light-emitting section sequentially has a first barrier layer, a second barrier layer, a third barrier layer, said well layer, and a forth barrier layer, said second barrier layer having a bandgap greater than those of said first barrier layer and said third barrier layer, said forth barrier layer having a bandgap greater than that of said second barrier layer.

2. The light-emitting structure as claimed in claim 1, wherein each of said $N_1$ quantum-well structure periods of said first light-emitting section sequentially has a first barrier layer, a second barrier layer, a third barrier layer, and said well layer, said second barrier layer having a bandgap greater than those of said first barrier layer and said third barrier layer.

3. The light-emitting structure as claimed in claim 2, wherein each of said first, second, third, and forth barrier layers of said N quantum-well structure periods has a thickness ranging from 10 Å to 1000 Å, and said well layer of each of said N quantum-well structure periods has a thickness ranging from 1 Å to 100 Å.

4. The light-emitting structure as claimed in claim 2, wherein each of said N quantum-well structure periods has a ratio of a total thickness of said first, second, and third barrier layers to a thickness of said well layer ranging from 5:1 to 20:1, and
wherein each of said $N_2$ quantum-well structure periods of said second light-emitting section has a ratio of a thickness of said forth barrier layer to the thickness of said well layer ranging from 5:1 to 20:1.

5. The light-emitting structure as claimed in claim 2, wherein said second barrier layer of each of said N quantum-well structure periods has a thickness greater than those of said first barrier layer and said third barrier layer, and
wherein in each of said $N_2$ quantum-well structure periods of said second light-emitting section, said forth barrier layer has a thickness greater than those of said first barrier layer and said third barrier layer.

6. The light-emitting structure as claimed in claim 2, wherein each of said first, second and third barrier layers of each of said $N_1$ quantum-well structure periods of said first light-emitting section and said $N_2$ quantum-well structure periods of said second light-emitting section is an n-type doped layer, and
wherein said forth barrier layer of each of $N_2$ quantum-well structure periods of said second light-emitting section is an unintentionally doped layer.

7. The light-emitting structure as claimed in claim 6, wherein said n-type doping layer has an n-type doping concentration ranging from $1\times10^{17}/cm^3$ to $1\times10^{19}/=^3$.

8. The light-emitting structure as claimed in claim 1, wherein $N_1$ and $N_2$ each ranges from 1 to 5.

9. The light-emitting structure as claimed in claim 2, wherein said well layer of each of said N quantum-well structure periods is made of $Al_xIn_yGa_{1-x-y}N$, and
wherein each of said first, second and third barrier layers of each of said N quantum-well structure periods and said forth barrier layer of each of said $N_2$ quantum-well structure periods of said second light-emitting section are made of $Al_pIn_qGa_{1-p-q}N$, where $0 \le x < p < 1$, and $0 \le q < y < 1$.

10. The light-emitting structure as claimed in claim 1, wherein said N quantum-well structure periods further includes $N_3$ quantum-well structure periods that defines a third light-emitting section interposed between said first light-emitting section and said second light-emitting section, said barrier layers of said $N_3$ quantum-well structure periods of said third light-emitting section having an average bandgap greater than that of said $N_2$ quantum-well structure periods of said first light-emitting section, and being less than that of said $N_2$ quantum-well structure periods of said second light-emitting section, and wherein said well layers of said $N_3$ quantum-well structure periods of said third light-emitting section have an average bandgap greater than that of said $N_2$ quantum-well structure periods of said second light-emitting section, and being less than that of said $N_1$ quantum-well structure periods of said first light-emitting section.

11. The light-emitting structure as claimed in claim 10, wherein each of said $N_3$ quantum-well structure periods of said third light-emitting section sequentially has a first barrier layer, a second barrier layer, a third barrier layer, and a well layer, said second barrier layer having a bandgap greater than those of said first barrier layer and said third barrier layer.

12. The light-emitting structure as claimed in claim 10, wherein in each of said $N_3$ quantum-well structure periods of said third light-emitting section, said second barrier layer has a thickness greater than those of said first barrier layer and said third barrier layer.

13. The light-emitting structure as claimed in claim 10, wherein each of said first, second, and third barrier layers of said $N_3$ quantum-well structure periods of said third light-emitting section has a thickness ranging from 10 Å to 1000 Å, and each of said well layers of said $N_3$ quantum-well structure periods of said third light-emitting section has a thickness ranging from 1 Å to 100 Å.

14. The light-emitting structure as claimed in claim 10, wherein each of said $N_3$ quantum-well structure periods has a ratio of a total thickness of said first, second, and third barrier layers to a thickness of said well layers ranging from 5:1 to 20:1.

15. The light-emitting structure as claimed in claim 10, wherein each of said first, second, and third barrier layers of each of said $N_3$ quantum-well structure periods of said third light-emitting section is an n-type doped layer, and said n-type doping layer has an n-type doping concentration ranging from $1\times10^{17}/cm^3$ to $1\times10^{19}/cm^3$.

16. The light-emitting structure as claimed in claim 10, wherein the $N_3$ ranges from 1 to 5.

17. The light-emitting structure as claimed in claim 10, wherein said well layer of each of said $N_3$ quantum-well structure periods of said third light-emitting section is made of $Al_xIn_yGa_{1-x-y}N$, and each of said first, second, and third barrier layers of each of said $N_3$ quantum-well structure periods of said third light-emitting section is made of $Al_pIn_qGa_{1-p-q}N$, where $0 \leq x < p < 1$, and $0 \leq q < y < 1$.

18. A method for producing a light-emitting structure as claimed in claim 1, comprising the steps of:
   (a) providing a substrate;
   (b) forming a nucleation layer on the substrate; and
   (c) forming the n-type layer, the active layer and the p-type layer in such order on the nucleation layer.

19. The method as claimed in claim 18, wherein the barrier layers of the first light-emitting section are grown at an average growth rate greater than that of the barrier layers of the second light-emitting section, and the well layer of the first light-emitting section is grown at an average growth rate greater than that for growing the well layer of the second light-emitting section.

20. The method as claimed in claim 18, wherein in each of the N quantum-well structure periods, either of the first barrier layer and the third barrier layer are grown at an average growth rate not greater than that of the second barrier layer.

21. A light-emitting device comprising: a substrate and a light-emitting structure as claimed in claim 1 formed on said substrate.

22. The light-emitting device as claimed in claim 21, wherein said light-emitting device has a horizontal area ranging from $1\times1$ μm² to $300\times300$ μm².

* * * * *